United States Patent
Jun et al.

(10) Patent No.: US 10,338,134 B2
(45) Date of Patent: Jul. 2, 2019

(54) INTERFACE BOARD, A MULTICHIP PACKAGE (MCP) TEST SYSTEM INCLUDING THE INTERFACE BOARD, AND AN MCP TEST METHOD USING THE MCP TEST SYSTEM

(71) Applicant: SAMSUNG ELECTRONICS CO., LTD., Suwon-si, Gyeonggi-do (KR)

(72) Inventors: Min-Chul Jun, Gwangmyeong-si (KR); Yun-Bo Yang, Asan-si (KR); Dong-Ho Lee, Asan-si (KR); Tae-Hwan Oh, Asan-si (KR); Dong-Han Yoon, Sejong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 269 days.

(21) Appl. No.: 15/333,699

(22) Filed: Oct. 25, 2016

(65) Prior Publication Data
US 2017/0139004 A1 May 18, 2017

(30) Foreign Application Priority Data
Nov. 13, 2015 (KR) ........................ 10-2015-0159922

(51) Int. Cl.
*G01R 31/28* (2006.01)
*H05K 1/11* (2006.01)
(Continued)

(52) U.S. Cl.
CPC ..... *G01R 31/2893* (2013.01); *G01R 31/2889* (2013.01); *G01R 31/2896* (2013.01);
(Continued)

(58) Field of Classification Search
CPC .......................... G01R 31/2893; G01R 31/01;
G01R 31/2851; G01R 31/2887; G01R 31/2867
(Continued)

(56) References Cited

U.S. PATENT DOCUMENTS 5,644,245 A * 7/1997 Saitoh ................ G01R 1/06794
324/750.18
5,764,071 A * 6/1998 Chan .................... G01R 1/0408
324/756.02
(Continued)

FOREIGN PATENT DOCUMENTS

JP 2007-114163 5/2007
JP 4278360 3/2009
(Continued)

*Primary Examiner* — Christopher P McAndrew
(74) *Attorney, Agent, or Firm* — F. Chau & Associates, LLC

(57) ABSTRACT

In an interface board for testing a multichip package, the multichip package includes a first type semiconductor chip and a second type semiconductor chip, the interface board includes a first surface facing the multichip package and a second surface facing a test apparatus, the first surface includes upper terminals that are electrically connected to terminals of the multichip package, the second surface includes lower terminals that are electrically connected to the test apparatus, and the upper terminals include a first upper terminal group for testing the first type semiconductor chip and a second upper terminal group for testing whether a crack defect exists in the second type semiconductor chip.

18 Claims, 12 Drawing Sheets

(51) Int. Cl.
*H05K 1/02* (2006.01)
*H05K 1/18* (2006.01)
*H01L 25/07* (2006.01)
*G01R 31/3185* (2006.01)

(52) U.S. Cl.
CPC ......... *H01L 25/074* (2013.01); *H05K 1/0268* (2013.01); *H05K 1/111* (2013.01); *H05K 1/181* (2013.01); *G01R 31/318513* (2013.01); *H01L 2224/48227* (2013.01); *H01L 2225/0651* (2013.01); *H01L 2225/0652* (2013.01); *H01L 2924/15311* (2013.01); *H01L 2924/181* (2013.01); *H05K 2201/10159* (2013.01); *H05K 2201/10378* (2013.01)

(58) Field of Classification Search
USPC .................................................. 324/757.05
See application file for complete search history.

(56) References Cited

U.S. PATENT DOCUMENTS

| | | | |
|---|---|---|---|
| 5,945,837 A * | 8/1999 | Fredrickson | G01R 1/07307 324/754.08 |
| 6,292,003 B1 * | 9/2001 | Fredrickson | G01R 1/0483 324/750.25 |
| 6,324,485 B1 * | 11/2001 | Ellis | G01R 31/31905 702/108 |
| 6,812,728 B2 | 11/2004 | Beppu | |
| 6,925,018 B2 | 8/2005 | Tatsumi | |
| 6,943,577 B2 | 9/2005 | Shin et al. | |
| 7,075,175 B2 | 7/2006 | Kazi et al. | |
| 7,098,680 B2 * | 8/2006 | Fukushima | G01R 31/2889 324/756.02 |
| 7,327,154 B2 | 2/2008 | Shin et al. | |
| 7,541,612 B2 | 6/2009 | Han | |
| 7,569,919 B2 | 8/2009 | Lee | |
| 7,964,445 B2 | 6/2011 | Meir | |
| 2004/0017216 A1 * | 1/2004 | Mardi | G01R 1/0408 324/754.03 |
| 2004/0201012 A1 * | 10/2004 | Faris | B81C 1/00238 257/40 |
| 2005/0105351 A1 * | 5/2005 | Kojima | H05K 13/082 365/202 |
| 2007/0096759 A1 * | 5/2007 | Weinraub | G01R 31/3167 324/756.01 |
| 2008/0191687 A1 * | 8/2008 | Shim | G01R 31/2893 324/757.01 |
| 2009/0003424 A1 * | 1/2009 | Waayers | G01R 31/31858 375/226 |
| 2010/0109652 A1 * | 5/2010 | Beom | G01R 31/2893 324/754.09 |
| 2010/0239155 A1 * | 9/2010 | Ichikawa | G01R 31/2874 382/141 |
| 2011/0215826 A1 * | 9/2011 | Hwang | G01R 31/26 324/762.02 |
| 2012/0327729 A1 * | 12/2012 | Yeh | G11C 29/56 365/201 |
| 2014/0266285 A1 * | 9/2014 | Detofsky | G01R 31/2889 324/756.05 |
| 2016/0258996 A1 * | 9/2016 | Lim | G01R 19/16533 |

FOREIGN PATENT DOCUMENTS

| | | |
|---|---|---|
| JP | 2009-198438 | 9/2009 |
| KR | 1020090003745 | 1/2009 |

* cited by examiner

INTERFACE BOARD, A MULTICHIP PACKAGE (MCP) TEST SYSTEM INCLUDING THE INTERFACE BOARD, AND AN MCP TEST METHOD USING THE MCP TEST SYSTEM

CROSS-REFERENCE TO RELATED APPLICATION

This application claims priority under 35 U.S.C. § 119 to Korean Patent Application No. 10-2015-0159922, filed on Nov. 13, 2015, in the Korean Intellectual Property Office, the disclosure of which is incorporated by reference herein in its entirety.

TECHNICAL FIELD

The inventive concept relates to an interface board, a multichip package (MCP) test system comprising the interface board, and an MCP test method using the MCP test system.

DISCUSSION OF RELATED ART

A multichip package (MCP) product including two or more types of semiconductor chips that are not connected to each other undergoes various tests. A final test may be performed on a first type semiconductor chip of the two or more types of semiconductor chips. At this time, a second type semiconductor chip of the two or more types of semiconductor chips may have already passed a different test. However, the second type semiconductor chip may have been subsequently cracked in a transfer process or in a process of preparing the first type semiconductor chip for testing.

SUMMARY

According to an exemplary embodiment of the inventive concept, there is provided an interface board for testing a multichip package, wherein the multichip package includes a first type semiconductor chip and a second type semiconductor chip, the interface board includes a first surface facing the multichip package and a second surface facing a test apparatus, the first surface includes upper terminals that are configured to be electrically connected to terminals of the multichip package, the second surface includes lower terminals that are configured to be electrically connected to the test apparatus, and the upper terminals include a first upper terminal group for testing the first type semiconductor chip and a second upper terminal group for testing whether a crack defect exists in the second type semiconductor chip.

According to an exemplary embodiment of the inventive concept, there is provided a method of testing a multichip package including a first type semiconductor chip and a second type semiconductor chip, the method includes disposing an interface board between the multichip package and a test apparatus, applying a first signal to the multichip package to test the first type semiconductor chip, applying a second signal to the multichip package to test whether a crack defect exists in the second type semiconductor chip, and determining the multichip package to be non-defective when a current flowing in the second type semiconductor chip in response to the second signal is less than about 10 mA.

According to an exemplary embodiment of the inventive concept, there is provided a multichip package test system including a plurality of test apparatuses sequentially arranged in a test order, a plurality of chamber units for connecting semiconductor devices contained in a test tray to the plurality of test apparatuses, a transfer portion for carrying the test tray between the plurality of chamber units, and a controller for controlling the plurality of chamber units, wherein a multichip package includes a first type semiconductor chip and a second type semiconductor chip, a final test apparatus of the plurality of test apparatuses further includes an interface board for testing the multichip package, the interface board includes a first surface facing the multichip package and a second surface facing test terminals, the first surface includes upper terminals that are configured to be electrically connected to terminals of the multichip package, the second surface includes lower terminals that are configured to be electrically connected to the test terminals, and the upper terminals include a first upper terminal group for testing the first type semiconductor chip and a second upper terminal group for testing whether a crack defect exists in the second type semiconductor chip.

According to an exemplary embodiment of the inventive concept, there is provided an interface board having a first surface facing a multichip package to be tested and a second surface facing a test apparatus, wherein the first surface includes a first upper terminal group for testing a first type semiconductor chip of the multichip package and a second upper terminal group for testing whether a crack defect exists in a second type semiconductor chip of the multichip package, the second surface includes a first lower terminal group for connecting the first upper terminal group to the test apparatus and a second lower terminal for connecting the second upper terminal group to the test apparatus, and terminals of the second upper terminal group are electrically connected to one another in the interface board.

According to an exemplary embodiment of the inventive concept, there is provided an interface board comprising: a first terminal group and a second terminal group disposed on a first side of the interface board, wherein the first terminal group is configured to receive signals from a first type semiconductor device and the second terminal group is configured to receive signals from a second type semiconductor device; and a third terminal group and a fourth terminal disposed on a second side of the interface board, wherein the third terminal group corresponds to the first terminal group and the fourth terminal corresponds to the second terminal group, and wherein the fourth terminal is electrically connectable to a channel terminal of a test apparatus.

BRIEF DESCRIPTION OF THE DRAWINGS

The above and other features of the inventive concept will become more clearly understood by describing in detail exemplary embodiments thereof with reference to the accompanying drawings in which.

DETAILED DESCRIPTION OF THE EMBODIMENTS

Figure 1:
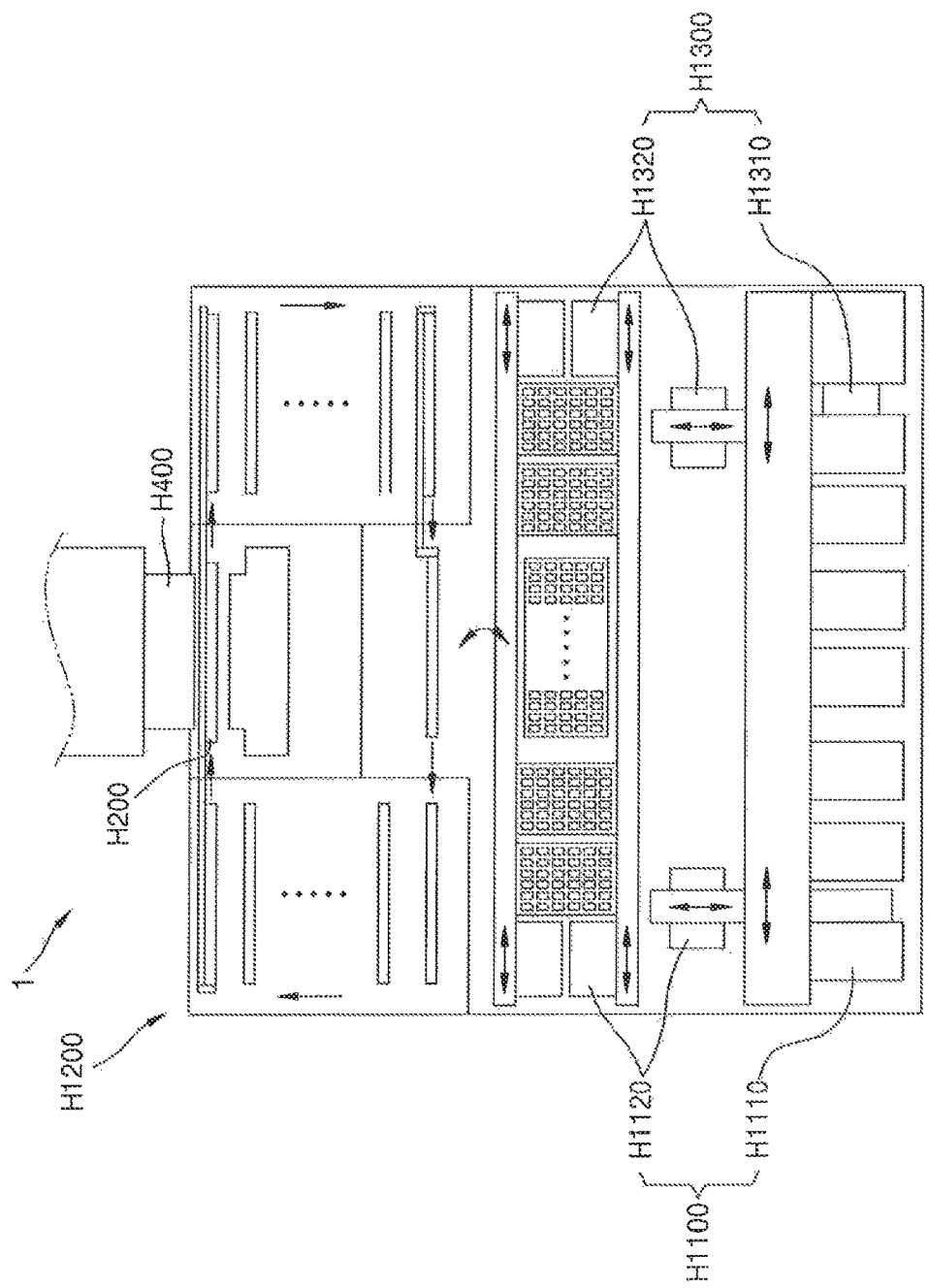
FIG. 1 is a schematic plan view of a test handler unit.

FIG. 1 is a schematic plan view of a test handler unit 1.

Referring to FIG. 1, the test handler unit 1 may include a loading unit H1100 for loading semiconductor devices contained in a customer tray, into a test tray H200, a test unit H1200 for connecting the semiconductor devices loaded in the test tray H200 to test equipment H400, and an unloading unit H1300 for classifying the tested semiconductor devices by grades according to a test result and loading the classified semiconductor devices into the customer tray.

The loading unit H1100 performs a process of loading semiconductor devices to be tested into the test tray H200. The loading unit H1100 may include a loading stacker H1110 for storing a customer tray containing the semiconductor devices to be tested and a loading picker H1120 for transferring the semiconductor devices to be tested from the customer tray to the test tray H200. After the semiconductor devices to be tested are loaded in the test tray H200, the test tray H200 is transferred to the test unit H1200.

The test unit H1200 performs a process of electrically connecting the semiconductor devices loaded in the test tray H200 to the test equipment H400. Accordingly, as the semiconductor devices loaded in the test tray H200 are electrically connected to the test equipment H400, the test equipment H400 tests the semiconductor devices loaded in the test tray H200. When the testing of the semiconductor devices is completed, the test tray H200 is transferred to the unloading unit H1300.

The unloading unit H1300 performs an unloading process in which the tested semiconductor devices are removed from the test tray H200. The unloading unit H1300 may include an unloading stacker H1310 for storing the customer trays containing the tested semiconductor devices and an unloading picker H1320 for transferring the tested semiconductor devices from the test tray H200 to the customer tray. As the tested semiconductor devices are transferred to the customer tray, the test tray H200 is empted, and then, the empty test tray H200 is transferred back to the loading unit H1100.

As described above, the test handler unit 1 sequentially performs the loading process, the test process, and the unloading process while circularly transferring the test tray H200 in one apparatus.

Figure 2:
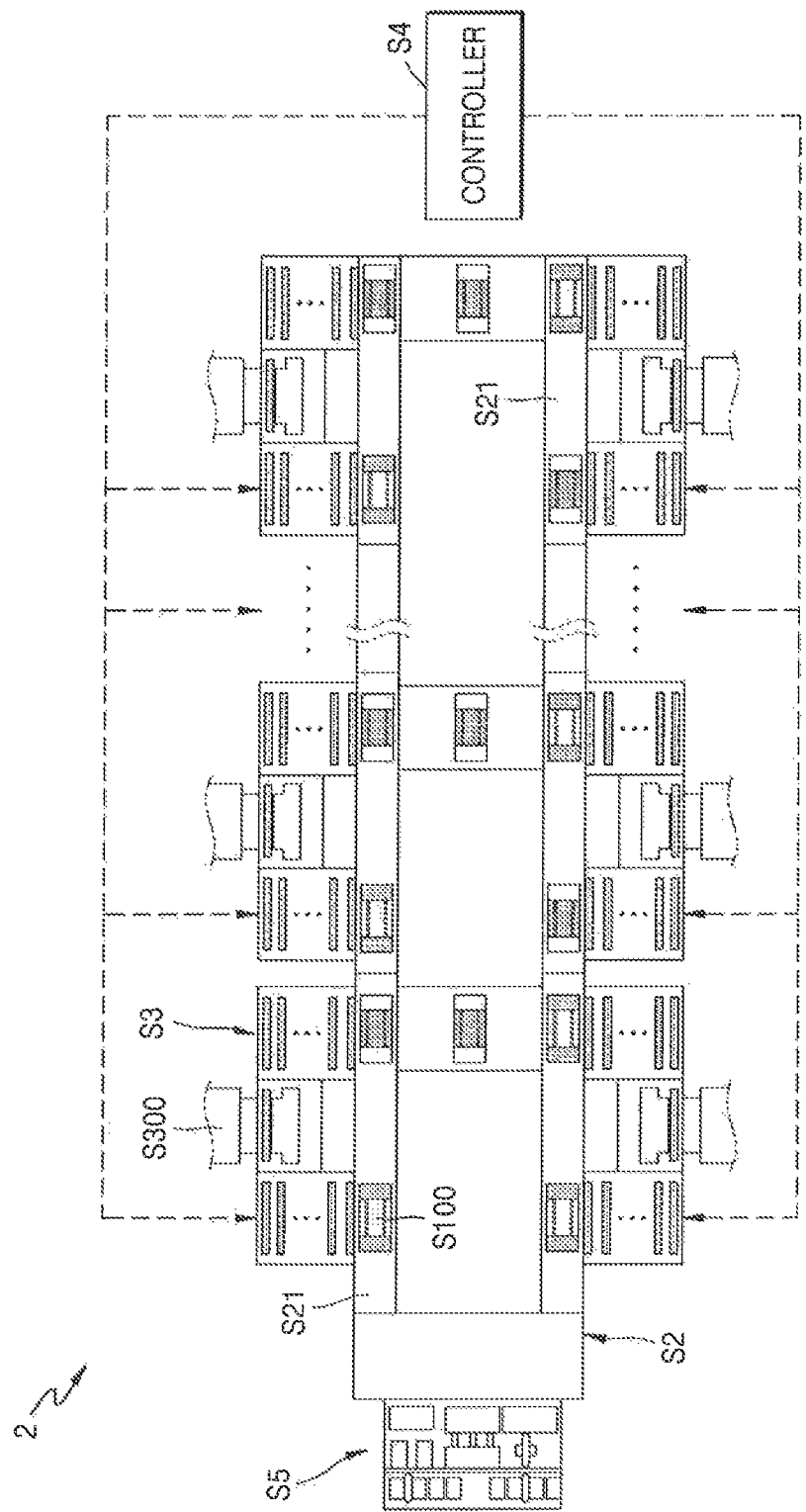
FIG. 2 is a view of a test handler system according to an exemplary embodiment of the inventive concept.

FIG. 2 is a view of a test handler system 2 according to an exemplary embodiment of the inventive concept.

Referring to FIG. 2, the test system 2 according to the present embodiment may include a conveyer unit S2 for carrying a test tray S100, a plurality of chamber units S3 for performing a test process of electrically connecting semiconductor devices contained in the test tray S100 to test equipment S300, a controller S4 for controlling each of the chamber units S3, and a sorting unit S5 separate from the chamber units S3.

The sorting unit S5 performs a process of loading semiconductor devices to be tested into the test tray S100 and a process of unloading tested semiconductor devices from the test tray S100.

The conveyer unit S2 carries the test tray S100 between the chamber units S3 and the sorting unit S5, which are separated from each other, such that the test process may be independently performed with respect to the performance of the loading process and the unloading process.

Figure 3:
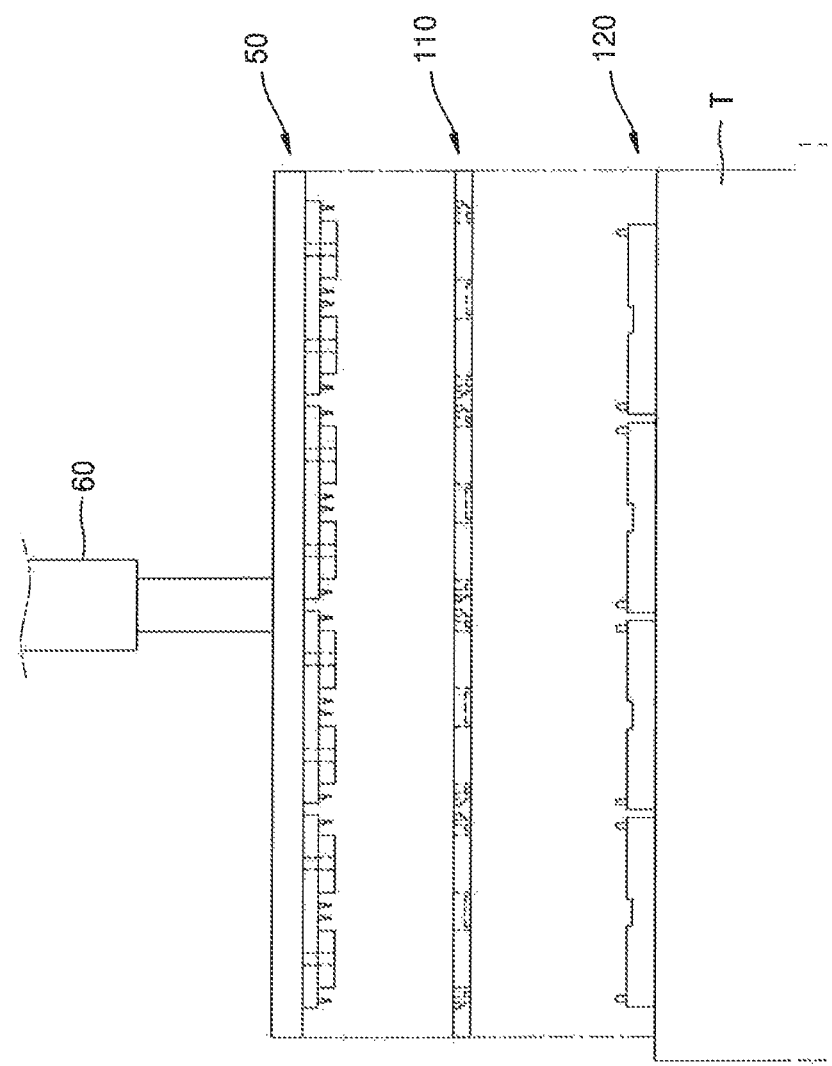
FIG. 3 is a side view illustrating a method of testing semiconductor devices using an interface board in test equipment according to an exemplary embodiment of the inventive concept.

FIG. 3 is a side view illustrating a method of testing semiconductor devices using an interface board in the test equipment according to an exemplary embodiment of the inventive concept.

Referring to FIG. 3, a tray 110 where a plurality of semiconductor devices D to be tested are disposed may be arranged above an interface board 120 on a test apparatus T. In this state, to enhance a close contact between the tray 110, the interface board 120, and the test apparatus T, a match plate 50 for applying a certain pressure from the above may be further provided.

The test apparatus T is configured to test particular properties of the semiconductor devices D. For example, only one or two or more of the properties may be tested.

As illustrated in FIG. 3, a pressurization apparatus 60 applies pressure to the match plate 50, and the pressure is transferred to the tray 110 so that the tray 110 may be made to closely contact the interface board 120. Furthermore, the interface board 120 may be made to closely contact the test apparatus T due to the pressure.

When the pressure is released after the test ends, the interface board 120 and the test apparatus T may be detached from each other by an elastic force applied by the interface board 120 or the test apparatus T. Furthermore, the tray 110 may be configured to be detached from the interface board 120.

Figure 4:
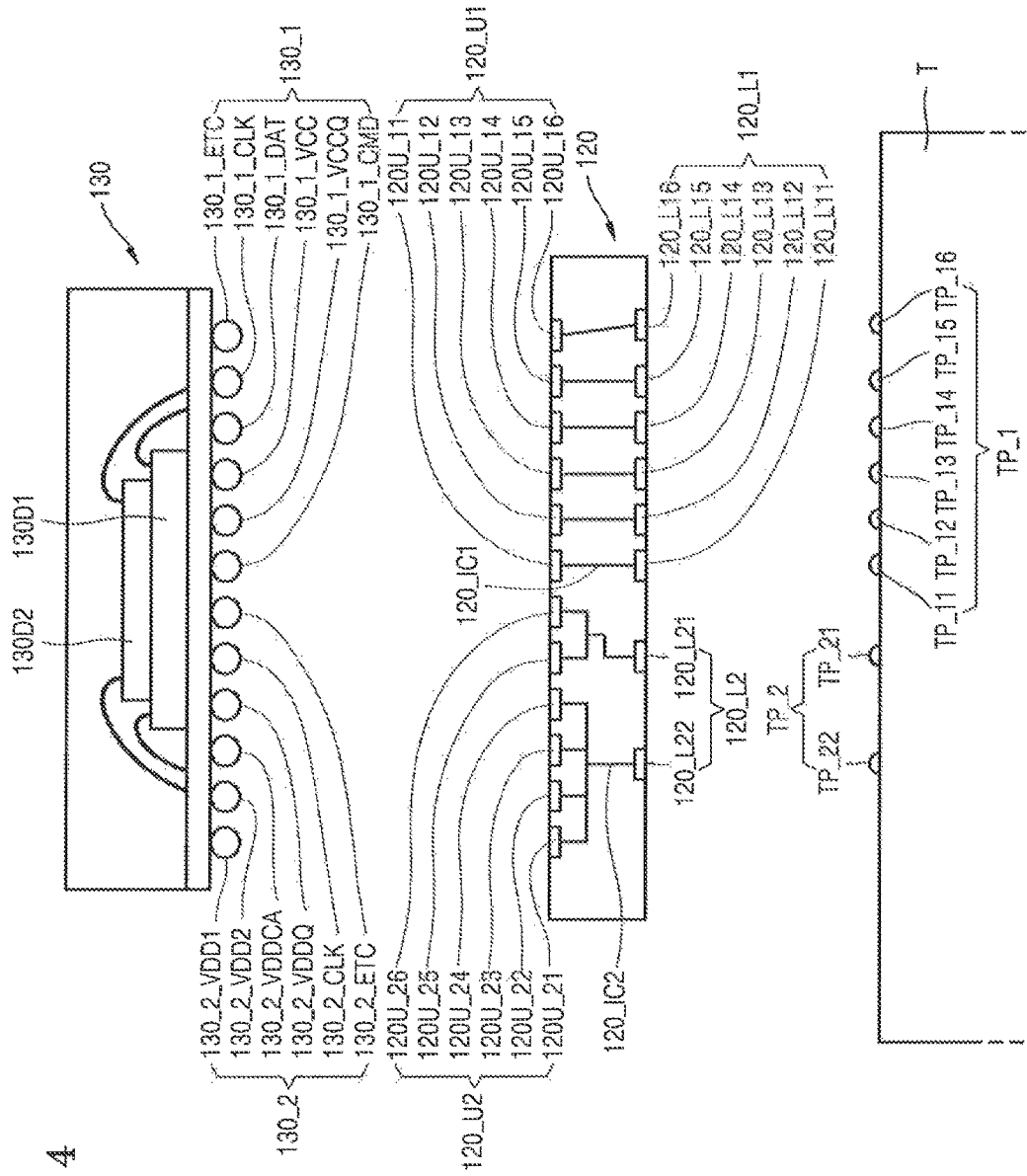
FIG. 4 is a side view illustrating an interface board according to an exemplary embodiment of the inventive concept, which is interposed between a test apparatus and a multichip package (MCP)

FIG. 4 is a side view illustrating the interface board 120 according to an exemplary embodiment of the inventive concept, which is interposed between the test apparatus T and a multichip package (MCP) 130.

Referring to FIG. 4, the MCP 130 may include a first type semiconductor chip 130D1 and a second type semiconductor chip 130D2. In an exemplary embodiment of the inventive concept, the first type semiconductor chip 130D1 may include a plurality of semiconductor chips. In an exemplary embodiment of the inventive concept, the second type semiconductor chip 130D2 may include a plurality of semiconductor chips.

Furthermore, the first type semiconductor chip 130D1 and the second type semiconductor chip 130D2 may not be electrically connected to each other in an MCP state. In other words, the first type semiconductor chip 130D1 may be connected to a first terminal group 130_1 through its own unique connection, and the first terminal group 130_1 may not be electrically connected to the second type semiconductor chip 130D2. Likewise, the second type semiconductor chip 130D2 may be connected to a second terminal group 130_2 through its own unique connection, and the second terminal group 130_2 may not be electrically connected to the first type semiconductor chip 130D1.

Accordingly, when any one of the first and second terminal groups 130_1 and 130_2 of the MCP 130 is designated, a semiconductor chip connected to the designated terminal group may be either the first type semiconductor chip 130D1 or the second type semiconductor chip 130D2. Furthermore, the designated terminal group may be connected to only one of the first type semiconductor chip 130D1 and the second type semiconductor chip 130D2.

Although FIG. 4 exemplarily illustrates a package in which the MCP 130 has a shape of a ball grid array (BGA), the present inventive concept is not limited thereto.

The first type semiconductor chip 130D1 and the second type semiconductor chip 130D2 may each be a volatile memory device or a non-volatile memory device. In an exemplary embodiment of the inventive concept, the first type semiconductor chip 130D1 and the second type semiconductor chip 130D2 may each be a dynamic random access memory (DRAM) device, a flash memory device, or a memory controller.

Furthermore, the first type semiconductor chip 130D1 and the second type semiconductor chip 130D2 may be different types of semiconductor devices.

For example, the first type semiconductor chip 130D1 may be a DRAM device and the second type semiconductor chip 130D2 may be a flash memory device. In an exemplary embodiment of the inventive concept, the first type semiconductor chip 130D1 may be a DRAM device and the second type semiconductor chip 130D2 may be a stack structure of a flash memory device and a controller chip. In an exemplary embodiment of the inventive concept, the first type semiconductor chip 130D1 may be a flash memory device and the second type semiconductor chip 130D2 may be a DRAM device. In an exemplary embodiment of the inventive concept, the first type semiconductor chip 130D1 may be a stack structure of a flash memory device and a controller chip and the second type semiconductor chip 130D2 may be a DRAM device.

In an exemplary embodiment of the inventive concept, the first terminal group 130_1 may include a plurality of terminals. For example, the first terminal group 130_1 may include power terminals 130_1_VCC and 130_1_VCCQ. Power may be applied to the power terminals 130_1_VCC and 130_1_VCCQ. Furthermore, the first terminal group 130_1 may include channel terminals 130_1_CMD, 130_1_DAT, 130_1_CLK, and 130_1_ETC. Channel signals may be applied to the channel terminals 130_1_CMD, 130_1_DAT, 130_1_CLK, and 130_1_ETC. The channel signals may be applied at a voltage lower than the power voltage.

In an exemplary embodiment of the inventive concept, the second terminal group 130_2 may include a plurality of terminals. For example, the second terminal group 130_2 may include power terminals 130_2_VDD1, 130_2_VDD2, 130_2_VDDCA, and 130_2_VDDQ. In a general operation, power is applied to the power terminals 130_2_VDD1, 130_2_VDD2, 130_2_VDDCA, and 130_2_VDDQ, however, in a test, channel signals may be applied to the power terminals 130_2_VDD1, 130_2_VDD2, 130_2_VDDCA, and 130_2_VDDQ. Furthermore, the second terminal group 130_2 may include channel terminals 130_2_CLK and 130_2_ETC. In the general operation, channel signals may be applied to the channel terminals 130_2_CLK and 130_2_ETC, however, the channel terminals 130_2_CLK and 130_2_ETC may be grounded during the test.

Although FIG. 4 illustrates an example in which the first terminal group 130_1 and the second terminal group 130_2 are solder balls, connectors having different shapes such as a land or a pin may be used in accordance with an exemplary embodiment of the inventive concept.

The first terminal group 130_1 may correspond to a first upper terminal group 120_U1 provided on an upper surface of the interface board 120. The first upper terminal group 120_U1 may include terminals 120_U11, 120_U12, 120_U13, 120_U14, 120_U15, and 120_U16 corresponding to the terminals of the first terminal group 130_1.

The second terminal group 130_2 may correspond to a second upper terminal group 120_U2 provided on the upper surface of the interface board 120. The second upper terminal group 120_U2 may include terminals 120_U21, 120_U22, 120_U23, 120_U24, 120_U25, and 120_U26 corresponding to the terminals of the second terminal group 130_2. The second upper terminal group 120_U2 may be provided to test only whether a crack defect exists in the second type semiconductor chip 130D2.

Terminals of the first upper terminal group 120_U1 may correspond to terminals of a first lower terminal group 120_L1 provided on a lower surface of the interface board 120. In other words, the terminals 120_U11, 120_U12, 120_U13, 120_U14, 120_U15, and 120_U16 may correspond to terminals 120_L11, 120_L12, 120_L13, 120_L14, 120_L15, and 120_L16. The terminals 120_U11, 120_U12, 120_U13, 120_U14, 120_U15, and 120_U16 of the first upper terminal group 120_U1 may be electrically connected to the terminals 120_L11, 120_L12, 120_L13, 120_L14, 120_L15, and 120_L16 of the first lower terminal group 120_L1, respectively, via a first internal line 120_IC1.

Terminals of the second upper terminal group 120_U2 may correspond to terminals of a second lower terminal group 120_L2 provided on the lower surface of the interface board 120.

Among the terminals of the second upper terminal group 120_U2, the terminals 120_U21, 120_U22, 120_U23, and 120_U24 corresponding to the power terminals 130_2_VDD1, 130_2_VDD2, 130_2_VDDCA, and 130_2_VDDQ of the second terminal group 130_2 may be electrically connected to an identical single terminal 120_L22. The terminals 120_U21, 120_U22, 120_U23, and 120_U24 may be electrically connected to one another through a wiring inside the interface board 120. Furthermore, the terminals 120_U21, 120_U22, 120_U23, and 120_U24 may be electrically connected to the terminal 120_L22 via the wiring inside the interface board 120, in other words, a second internal line 120_IC2.

Among the terminals of the second upper terminal group 120_U2, the terminals 120_U25 and 120_U26 corresponding to the channel terminals 130_2_CLK and 130_2_ETC of the second terminal group 130_2 may be electrically connected to an identical single terminal 120_L21. The terminals 120_U25 and 120_U26 may be electrically connected to each other via a wiring inside the interface board 120. Furthermore, the terminals 120_U25 and 120_U26 may be electrically connected to the terminal 120_L21 via the wiring inside the interface board 120.

The first lower terminal group 120_L1 of the interface board 120 may correspond to a first test terminal group TP_1 for testing the first type semiconductor chip 130D1, among the terminals TP_1 and TP_2 of the test apparatus T. In other words, the terminals 120_L11, 120_L12, 120_L13, 120_L14, 120_L15, and 120_L16 may correspond to the terminals TP_11, TP_12, TP_13, TP_14, TP_15, and TP_16. The terminals TP_11, TP_12, TP_13, TP_14, TP_15, and TP_16 may apply various signals to test the first type semiconductor chip 130D1.

The second lower terminal group 120_L2 of the interface board 120 may correspond to the second test terminal group TP_2 for testing whether a crack defect exists in the second type semiconductor chip 130D2, among the terminals TP_1 and TP_2 of the test apparatus T. In other words, the terminals 120_L21 and 120_L22 may correspond to terminals TP_21 and TP_22.

A channel signal to test whether a crack defect exists in the second type semiconductor chip 130D2 may be input to the channel terminal TP_22. In an exemplary embodiment of the inventive concept, the terminal TP_21 may be grounded while the channel signal to test whether a crack defect exists in the second type semiconductor chip 130D2 is input to the channel terminal TP_22.

Furthermore, while the channel signal to test whether a crack defect exists in the second type semiconductor chip 130D2 is input to the terminal TP_22, the terminals TP_11, TP_12, TP_13, TP_14, TP_15, and TP_16 of the first test terminal group TP_1 may be grounded.

The channel signal input to the terminal TP_22 to test whether a crack defect exists in the second type semiconductor chip 130D2 may have a voltage of about 0.3 V or more. If the second type semiconductor chip 130D2 does not have a crack defect, when a channel signal of about 0.3 V or more is applied to the terminal TP_22 and the terminals TP_11, TP_12, TP_13, TP_14, TP_15, and TP_16 are grounded, substantially no current flows between any one of the terminals TP_11, TP_12, TP_13, TP_14, TP_15, and TP_16 and the terminal TP_22. However, if the second type semiconductor chip 130D2 has a crack defect, when a channel signal of about 0.3 V or more is applied to the terminal TP_22 and the terminals TP_11, TP_12, TP_13, TP_14, TP_15, and TP_16 are grounded, a current of about 10 mA or more may flow therebetween. This is due to a short circuit that is generated between the terminal of the second type semiconductor chip 130D2 and the grounded terminals due to the crack.

Although the current flowing when a short circuit is generated may vary depending on the amount of applied power, the current may still be about 10 mA or more.

Figure 5:
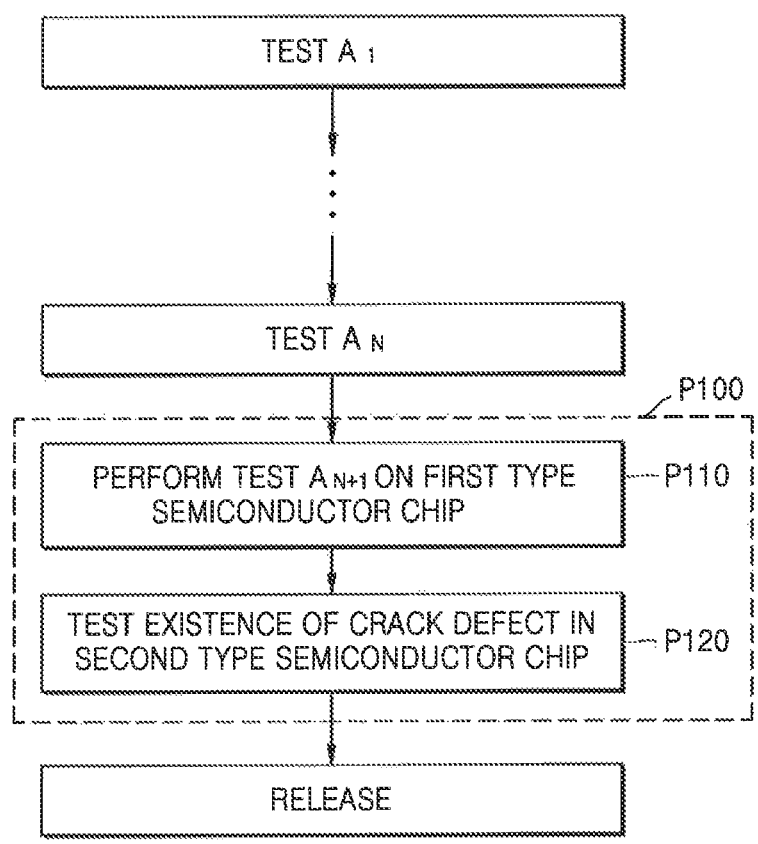
FIG. 5 is a flowchart for describing an MCP test method according to an exemplary embodiment of the inventive concept.

FIG. 5 is a flowchart for describing an MCP test method according to an exemplary embodiment of the inventive concept.

Referring to FIG. 5, a plurality of tests, in other words, a test $A_1$ to a test $A_N$, may be performed on the MCP 130. The test $A_1$ to the test $A_N$ may include a test on the first type semiconductor chip 130D1 and a test on the second type semiconductor chip 130D2 in the MCP 130.

Previously, when the first type semiconductor chip 130D1 undergoes a test $A_{N+1}$, which is the last test of all of the tests, and the first type semiconductor chip 130D1 has passed all of the tests, the first type semiconductor chip 130D1 is released as a passed product. However, even though the second type semiconductor chip 130D2 has passed all of the tests from the test $A_1$ to the test $A_N$, the second type semiconductor chip may acquire a defect, such as a chip crack, when the test $A_{N+1}$ is performed on the first type semiconductor chip 130D1. Even when a process of testing the second type semiconductor chip 130D2 is inserted just before the test $A_{N+1}$ of the first type semiconductor chip 130D1, a crack defect may still be generated in the second type semiconductor chip 130D2 when performing the test $A_{N+1}$ on the first type semiconductor chip 130D1. Furthermore, even when the process of testing the second type semiconductor chip 130D2 is inserted just after the test $A_{N+1}$ of the first type semiconductor chip 130D1, the first type semiconductor chip 130D1 itself may acquire a crack defect while testing the second type semiconductor chip 130D2.

In an exemplary embodiment of the inventive concept, after the test $A_{N+1}$ is performed on the first type semiconductor chip (P110), in the same test apparatus, without moving a tray, a channel signal of a relatively low voltage is applied to determine only the existence of a leakage current (P120). If there is a leakage current, it may be determined that a crack defect exists in the second type semiconductor chip 130D2. The MCP 130 may be directly released without a further test just after passing the above test method (P100).

Furthermore, since in the operation P100 only the existence of a crack defect is tested with respect to the second type semiconductor chip 130D2, all other tests for the second type semiconductor chip 130D2 may have already been performed by other test apparatuses prior to the operation P100. In other words, the test $A_1$ to the test $A_N$ may have already been performed on the second type semiconductor chip 130D2 upstream before the test $A_{N+1}$.

The interface board 120 described above with reference to FIG. 4 may be used in the operation P100 of FIG. 5.

Figure 6:
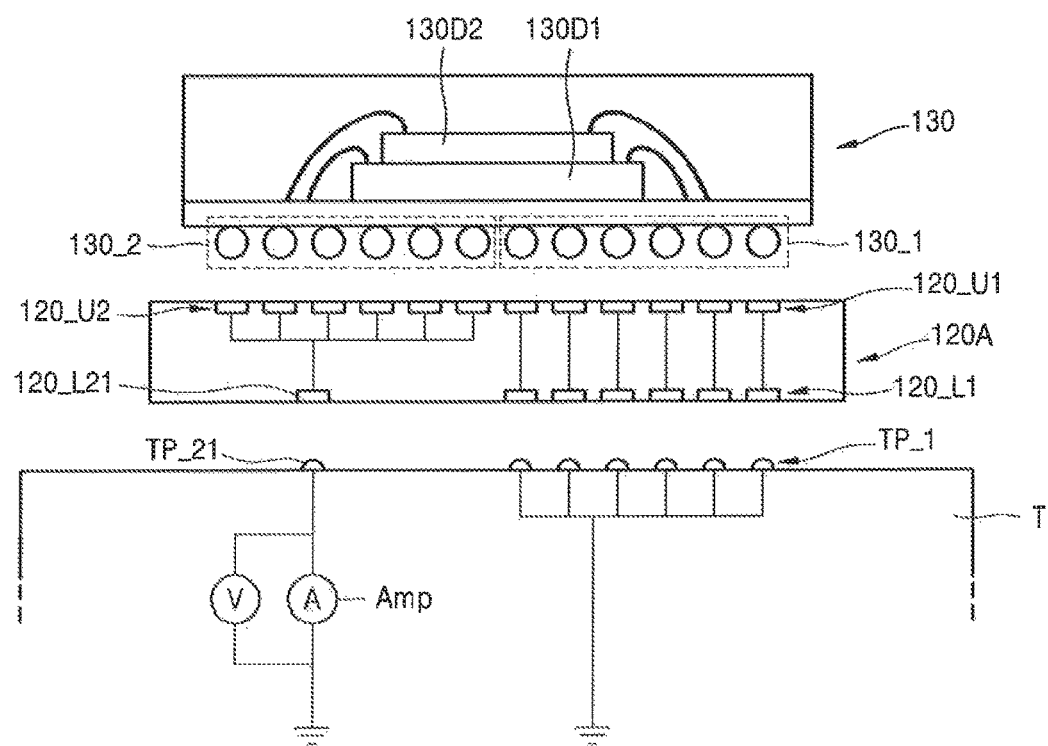
FIG. 6 is a side view illustrating a use state of an interface board according to an exemplary embodiment of the inventive concept.

FIG. 6 is a side view illustrating a use state of an interface board 120A according to an exemplary embodiment of the inventive concept.

Referring to FIG. 6, an MCP 130 is arranged above the test apparatus T with an interface board 120A interposed therebetween. The MCP 130 may include the first type semiconductor chip 130D1 and the second type semiconductor chip 130D2. In addition, the MCP 130 may include the first terminal group 130_1 and the second terminal group 130_2 on a lower surface thereof. Since a connection relationship therebetween is described above with reference to FIG. 4, redundant descriptions thereof are omitted herein.

The first upper terminal group 120_U1 corresponding to the first terminal group 130_1 is provided on an upper surface of the interface board 120A. In addition, the second upper terminal group 120_U2 corresponding to the second terminal group 130_2 is provided on the upper surface of the interface board 120A.

The first lower terminal group 120_L1 corresponding to the first upper terminal group 120_U1 is provided on the lower surface of the interface board 120A. In addition, the second lower terminal 120_L21 corresponding to the second upper terminal group 120_U2 is provided on the lower surface of the interface board 120A.

Unlike the embodiment of FIG. 4, in the embodiment of FIG. 6, the terminals of the second upper terminal group 120_U2 are all connected to the second lower terminal 120_L21, in other words an identical single terminal, regardless of whether the second lower terminal 120_L21 is a power terminal or not. The terminals of the second upper terminal group 120_U2 may be electrically connected to one another inside the interface board 120A.

The first lower terminal group 120_L1 may correspond to the terminals TP_1 of the test apparatus T. The second lower terminal 120_L21 may correspond to the terminal TP_21 of the test apparatus T. The second upper terminal group 120_U2 may be electrically connected to an identical single terminal via the second lower terminal 120_L21.

The terminal TP_21 of the test apparatus T may be a channel terminal. Accordingly, a channel signal may be input to the second type semiconductor chip 130D2 via the terminal TP_21 and the second lower terminal 120_L21. As described above, the channel signal may have a voltage of about 0.3 V or more.

After the test for the first type semiconductor chip 130D1 is completed, the terminal TP_1 is grounded so that the first lower terminal group 120_L1 and the first upper terminal group 120_U1 may be grounded and consequently the first terminal group 130_1 may be grounded. In this state, a channel signal may be applied to the terminal TP_21.

When the second type semiconductor chip 130D2 does not have a crack, a current of the second type semiconductor chip 130D2 detected by an ammeter Amp connected to the terminal TP_21 is within several milliamperes (mA). When the current detected by the ammeter Amp is substantially within about 10 mA, the second type semiconductor chip 130D2 may be determined to be a non-defective product.

When the second type semiconductor chip 130D2 has a crack, a leakage current is generated at a grounded point from the terminal TP_21 of the second type semiconductor chip 130D2, and thus, a slight current flow may be detected by the ammeter Amp. In other words, the ammeter Amp may detect a current of about 10 mA or more. In this case, the second type semiconductor chip 130D2 is determined to have a crack.

Figure 7:
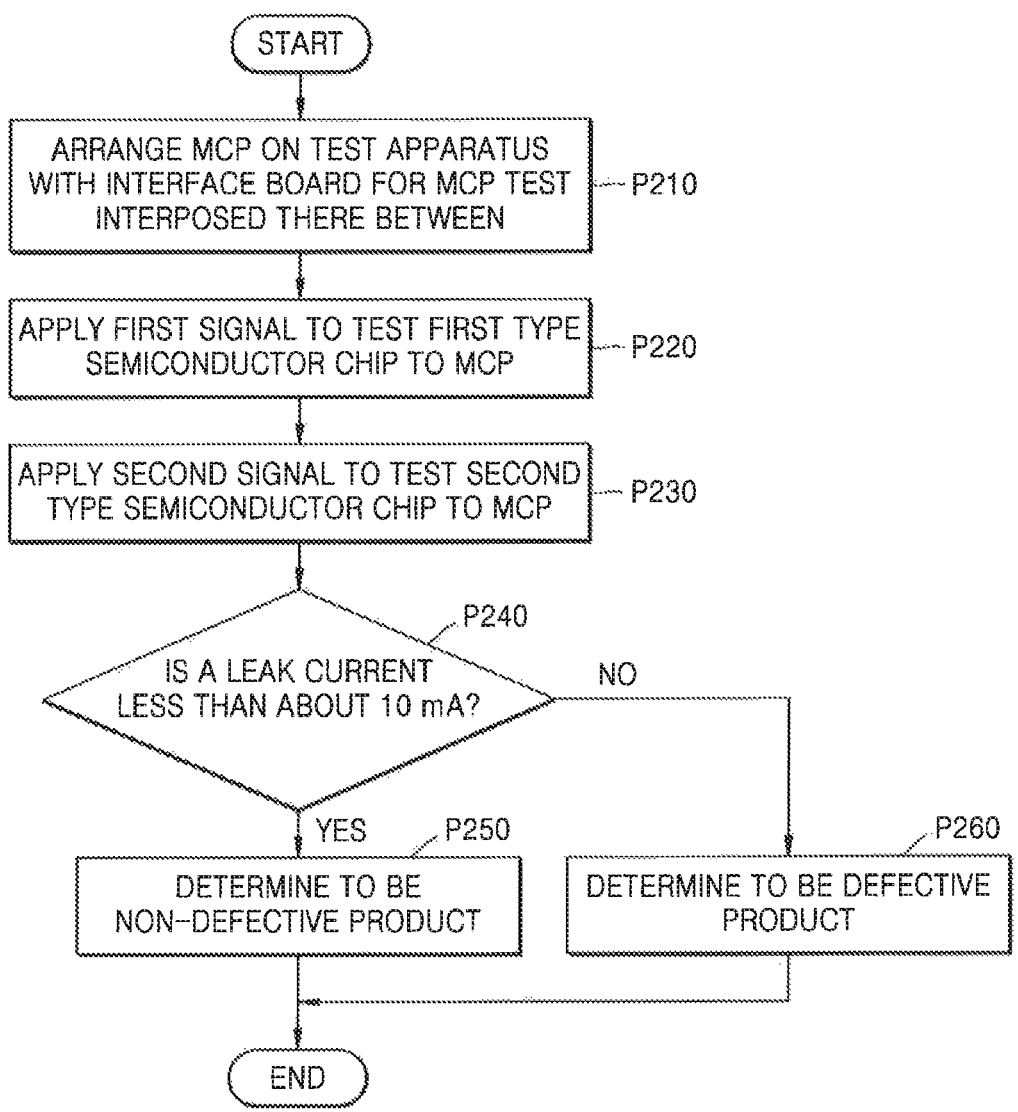
FIG. 7 is a flowchart for describing a method of determining a crack defect of a second type semiconductor chip, according to an exemplary embodiment of the inventive concept.

FIG. 7 is a flowchart for describing a method of determining a crack defect of the second type semiconductor chip 130D2, according to an exemplary embodiment of the inventive concept. The operations of FIG. 7 may correspond to the operation P100 of FIG. 5.

Referring to FIGS. 4, 5, and 7, the MCP 130 may be arranged above the test apparatus T by interposing the interface board 120 for an MCP test therebetween (P210).

The test apparatus T is a final test apparatus of a plurality of test apparatuses that the MCP 130 undergoes. The interface board 120 is an interface board customized for the test apparatus T.

The test apparatus T is configured to test a particular one of the properties of the first type semiconductor chip 130D1 with respect to the MCP 130. Furthermore, the test apparatus T may be an apparatus previously used to test the particular properties of the first type semiconductor chip 130D1.

Figure 8A:
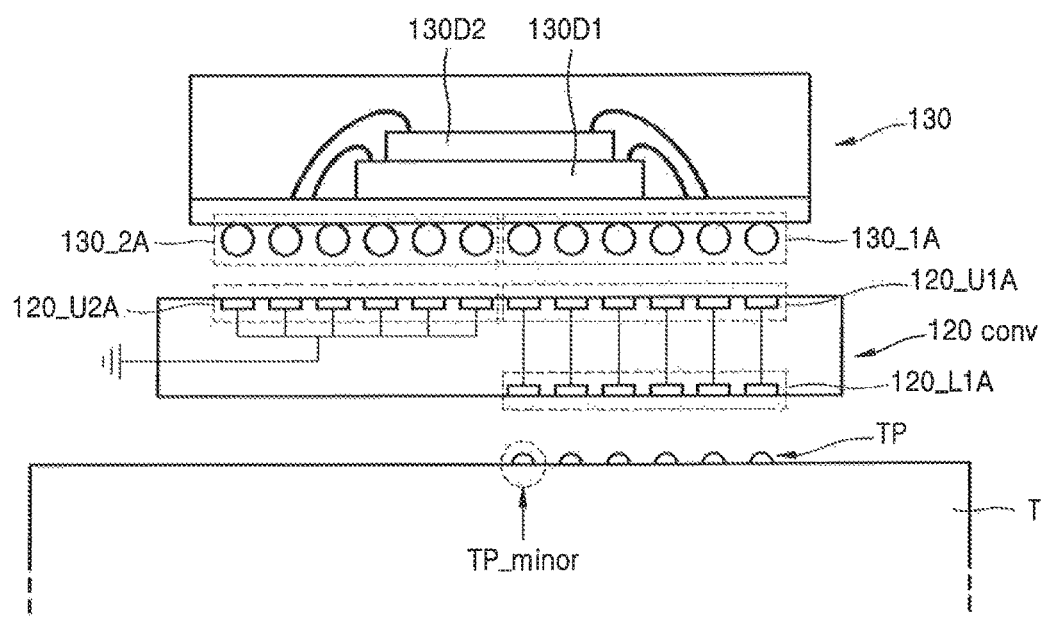
FIGS. 8A and 8B are side views illustrating a test method using the same test apparatus and only replacing the interface boards according to an exemplary embodiment of the inventive concept.
Figure 8B:
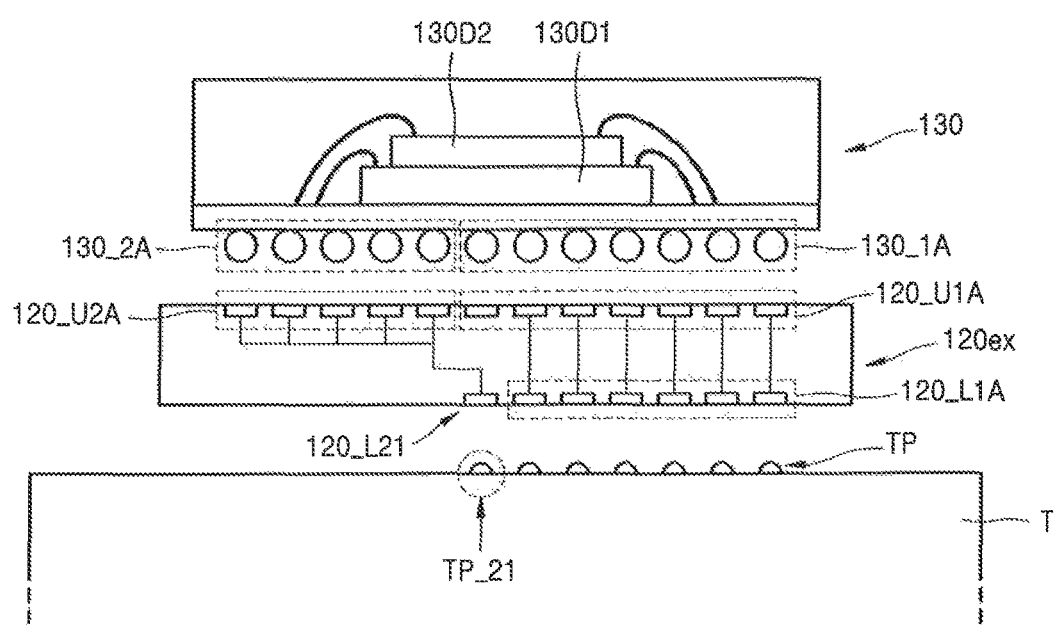

FIGS. 8A and 8B are side views illustrating a test method using the same test apparatus T and only replacing interface boards 120*conv* and 120*ex* according to an exemplary embodiment of the inventive concept.

Referring to FIG. 8A, the MCP 130 may include a first terminal group 130_1A corresponding to the first type semiconductor chip 130D1 and a second terminal group 130_2A corresponding to the second type semiconductor chip 130D2.

The interface board 120*conv* may include a first upper terminal group 120_U1A, and a second upper terminal group 120_U2A, on an upper surface thereof, respectively corresponding to the first terminal group 130_1A and the second terminal group 130_2A.

The interface board 120*conv* has a first lower terminal group 120_L1A corresponding to the first upper terminal group 120_U1A, and the first lower terminal group 120_L1A corresponds to terminals TP of the test apparatus T.

The second upper terminal group 120_U2A on the upper surface of the interface board 120*conv* may be grounded.

Of the terminals TP that are electrically connected to the first type semiconductor chip 130D1 via the interface board 120*conv*, there is a channel terminal TP_minor that is not important or is unnecessary for the test performed by a final test apparatus. When the channel terminal TP_minor is used for the test performed by the final test apparatus, as illustrated in FIG. 8A, the channel terminal TP_minor is connected to terminals of the interface board 120*conv*. However, this may not be the case if a test using the channel terminal TP_minor was performed in a test apparatus preceding the final test by the final test apparatus.

It is assumed in FIG. 8B that a test using the channel terminal TP_minor is performed by a preceding test apparatus, and thus, the channel terminal TP_minor is not needed for the test performed by the final test apparatus. In this case, in a modified interface board 120*ex*, the second upper terminal group 120_U2A may be connected to the second lower terminal 120_L21. The second lower terminal 120_L21 may be a terminal corresponding to the channel terminal TP_minor among the terminals belonging to the first lower terminal group 120_L1A according to the embodiment described above with reference to FIG. 8A.

As illustrated in FIG. 8B, the second upper terminal group 120_U2A is electrically connected to the second lower terminal 120_L21 that is a common single terminal in the interface board 120*ex*. Furthermore, the second lower terminal 120_L21 may be electrically connected to the terminal TP_21 that is the channel terminal TP_minor of the test apparatus T. The channel terminal TP_21 is a terminal for inputting a signal having a voltage lower than power.

As illustrated in FIG. 8B, the channel terminal TP_21 (TP_minor) is used for testing the second type semiconductor chip 130D2 after the change of the interface board. In other words, the channel terminal TP_21 may be electrically connected to the second type semiconductor chip 130D2 via the second lower terminal 120_L21 and the second upper terminal group 120_U2A.

Referring back to FIGS. 4, 5, and. 7, a first signal to test the first type semiconductor chip 130D1 may be applied to the MCP 130 (P220). The test of the first type semiconductor chip 130D1 may be, for example, a functional test, a direct current (DC) test, or an alternating current (AC) test, but the present inventive concept is not limited thereto.

The functional test may be a test to verify whether a semiconductor device operates corresponding to an intended logic function. The DC test may be a current (IDD) test, an electrostatic discharge (ESD) test, or an electrical overstress (EOS) test, but the present inventive concept is not limited thereto. The AC test may be a test related to a timing item, but the present inventive concept is not limited thereto.

When the first type semiconductor chip 130D1 passes the present test after applying the first signal to the first type semiconductor chip 130D1, a second signal is applied to the MCP 130 to test whether a crack defect exists in the second type semiconductor chip 130D2 (P230).

To accomplish this, the second signal may be applied to the channel terminal TP_21 (see FIG. 8B). The second signal may have a voltage lower than a generally supplied power, for example, a voltage of about 0.3 V or more. The second signal is sequentially transmitted to the second lower terminal 120_L21 and the second upper terminal group 120_U2A via the channel terminal TP_21, and then, to the second type semiconductor chip 130D2 via a power terminal of the second terminal group 130_2A. The second signal may be input to the second type semiconductor chip 130D2 via the power terminal of the second type semiconductor chip 130D2.

In this state, the first terminal group 130_1A and/or the first lower terminal group 120_L1A related to the first type semiconductor chip 130D1 may be all grounded.

As described above, when the second type semiconductor chip 130D2 has no crack defect, a current flows as low as within several milliamperes in response to the second signal. In other words, when the current of the second terminal group 130_2A, which is the power terminal of the second type semiconductor chip 130D2, is as low as within several milliamperes (P240), the MCP 130 may be determined to be a non-defective product (P250). In this state, the current flowing as low as within several milliamperes means a current less than about 10 mA, where a difference of about 0.5 mA to 8 mA exists according to the type of device.

When a current of about 10 mA or more flows in the second type semiconductor chip 130D2 in response to the second signal (P240), the MCP 130 may be determined to be defective (P260).

Figure 9:
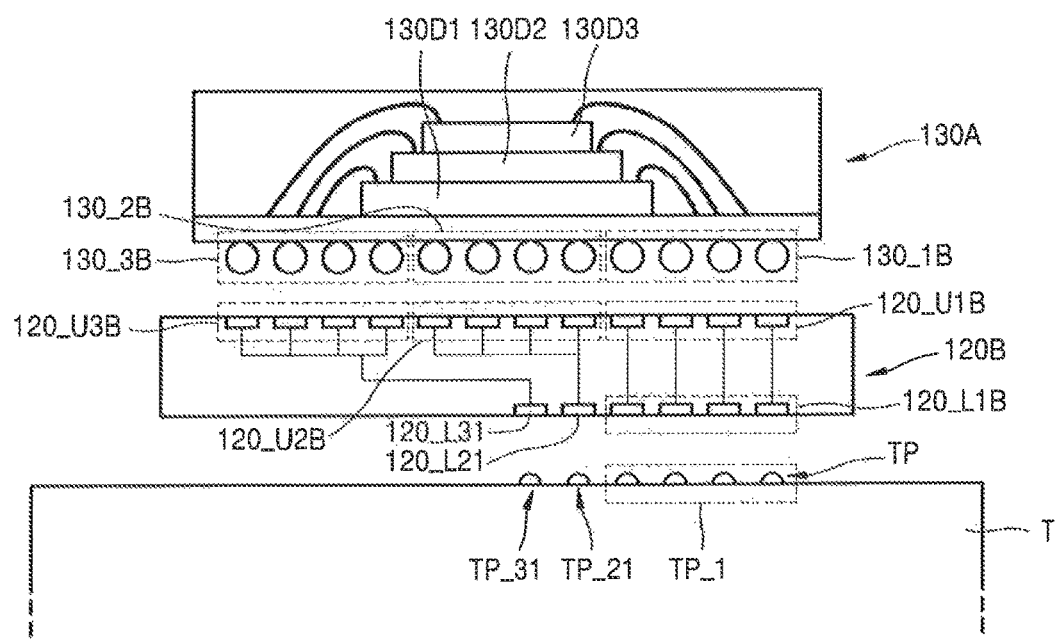
FIGS. 9 and 10 are side views illustrating use states of interface boards according to exemplary embodiments of the inventive concept.

FIG. 9 is a side view illustrating a use state of an interface board 120B according to an exemplary embodiment of the inventive concept.

Referring to FIG. 9, an MCP 130A may include the first type semiconductor chip 130D1, the second type semiconductor chip 130D2, and a third type semiconductor chip 130D3. In an exemplary embodiment of the inventive concept, the first type semiconductor chip 130D1 may include a plurality of semiconductor chips. In an exemplary embodiment of the inventive concept, the second type semiconductor chip 130D2 may include a plurality of semiconductor chips. In an exemplary embodiment of the inventive concept, the third type semiconductor chip 130D3 may include a plurality of semiconductor chips.

Furthermore, the first type semiconductor chip 130D1, the second type semiconductor chip 130D2, and the third type semiconductor chip 130D3 in the MCP 130A may not be electrically connected to one another. In other words, the first type semiconductor chip 130D1 may be connected to a first terminal group 130_1B through its own unique connection, and the first terminal group 130_1B may not be electrically connected to the second type semiconductor chip 130D2 and the third type semiconductor chip 130D3. Likewise, the second type semiconductor chip 130D2 is connected to a second terminal group 130_2B through its own unique connection. The second terminal group 130_2B may not be electrically connected to the first type semiconductor chip 130D1 and the third type semiconductor chip 130D3. Furthermore, the third type semiconductor chip 130D3 is connected to a third terminal group 130_3B through its own unique connection, and the third terminal group 130_3B may not be electrically connected to the first type semiconductor chip 130D1 and the second type semiconductor chip 130D2.

Accordingly, when any one of the terminals of the first to third terminal groups 130_1B, 130_2B, and 130_3B provided under the MCP 130A is designated, the semiconductor chip connected to the designated terminal may be any one of the first type semiconductor chip 130D1, the second type semiconductor chip 130D2, and the third type semiconductor chip 130D3. Furthermore, the designated terminal may be connected to only one of the first type semiconductor chip 130D1, the second type semiconductor chip 130D2, and the third type semiconductor chip 130D3.

The first type semiconductor chip 130D1, the second type semiconductor chip 130D2, and the third type semiconductor chip 130D3 may each be volatile memory devices or non-volatile memory devices. In an exemplary embodiment of the inventive concept, the first type semiconductor chip 130D1, the second type semiconductor chip 130D2, and the third type semiconductor chip 130D3 may each be DRAM devices, flash memory devices, or memory controllers. Furthermore, the first type semiconductor chip 130D1, the second type semiconductor chip 130D2, and the third type semiconductor chip 130D3 may be different types of semiconductor devices.

For example, the first type semiconductor chip 130D1 may be a DRAM device, the second type semiconductor chip 130D2 may be a flash memory device, and the third type semiconductor chip 130D3 may be a controller chip. In an exemplary embodiment of the inventive concept, the first type semiconductor chip 130D1 may be a DRAM device, the second type semiconductor chip 130D2 may be a controller chip, and the third type semiconductor chip 130D3 may be a flash memory device.

The first terminal group 130_1B may correspond to a first upper terminal group 120_U1B provided on an upper surface of the interface board 120B. The second terminal group 130_2B may correspond to a second upper terminal group 120_U2B provided on the upper surface of the interface board 120B. The third terminal group 130_3B may correspond to a third upper terminal group 120_U3B provided on the upper surface of the interface board 120B.

The second upper terminal group 120_U2B may be used to test only whether the second type semiconductor chip 130D2 has a crack defect. The third upper terminal group 120_U3B may be used to test only whether a crack defect exists in the third type semiconductor chip 130D3.

Terminals of the first upper terminal group 120_U1B may respectively correspond to terminals of a first lower terminal group 120_L1B provided on a lower surface of the interface board 120B. Terminals of the second upper terminal group 120_U2B may respectively correspond to the second lower terminal 120_L21 provided on the lower surface of the interface board 120B. Terminals of the third upper terminal group 120_U3B may respectively correspond to a third lower terminal 120_L31 provided on the lower surface of the interface board 120B.

The first lower terminal group 120_L1B of the interface board 120B may correspond to the first test terminal group TP_1 for testing the first type semiconductor chip 130D1, among the terminals TP of the test apparatus T.

The second lower terminal 120_L21 and the third lower terminal 120_L31 of the interface board 120B may respectively correspond to the channel terminal TP_21 and a channel terminal TP_31 among the terminals TP of the test apparatus T.

A second signal that is a channel signal to test whether a crack defect exists in the second type semiconductor chip 130D2 may be input to the channel terminal TP_21. A third signal that is a channel signal to test whether a crack defect exists in the third type semiconductor chip 130D3 may be input to the channel terminal TP_31. The first lower terminal group 120_L1B may be entirely grounded.

Figure 10:
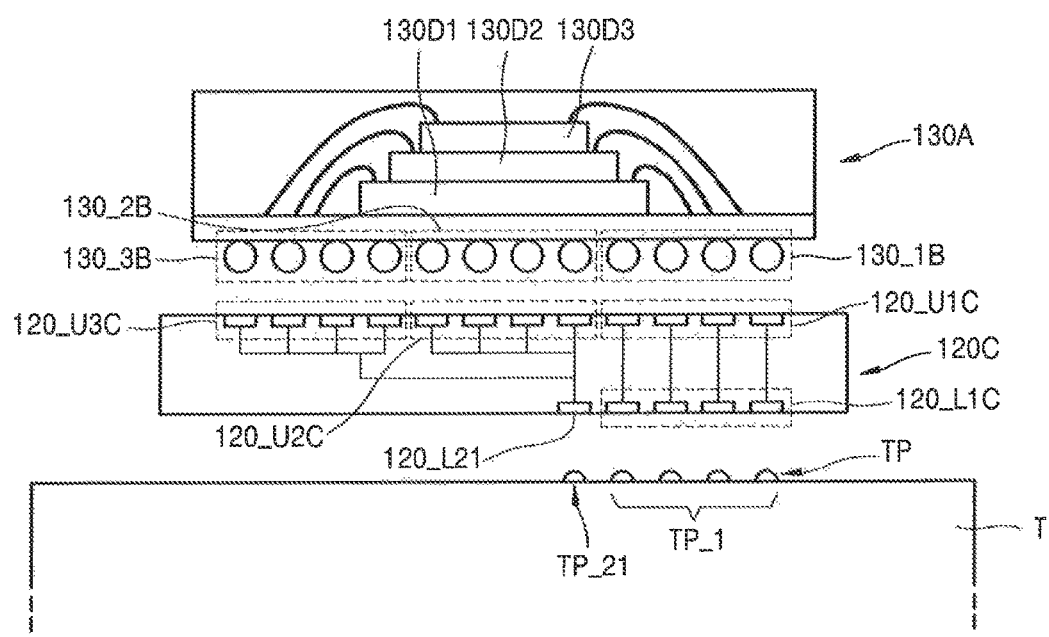

FIG. 10 is a side view illustrating a use state of an interface board 120C according to an exemplary embodiment of the inventive concept.

Referring to FIG. 10, both of a second upper terminal group 120_U2C and a third upper terminal group 120_U3C are connected to the second lower terminal 120_L21. Unlike the embodiment of FIG. 9, the third lower terminal 120_L31 is not provided.

The first terminal group 130_1B may correspond to a first upper terminal group 120_U1C provided on an upper surface of an interface board 120C. The second terminal group 130_2B may correspond to the second upper terminal group 120_U2C provided on the upper surface of the interface board 120C. The third terminal group 130_3B may correspond to the third upper terminal group 120_U3C provided on the upper surface of the interface board 120C.

The second upper terminal group 120_U2C may be used to test only whether a crack defect exists in the second type semiconductor chip 130D2. The third upper terminal group 120_U3C may be used to test only whether a crack defect exists in the third type semiconductor chip 130D3.

Terminals of the first upper terminal group 120_L1C may respectively correspond to terminals of a first lower terminal group 120_L1C provided on a lower surface of the interface board 120C. Both of the second upper terminal group 120_U2C and the third upper terminal group 120_U3C may be connected to the second lower terminal 120_L21. The second upper terminal group 120_U2C and the third upper terminal group 120_U3C may be electrically connected to each other inside the interface board 120C.

The first lower terminal group 120_L1C of the interface board 120C may correspond to the first test terminal group TP_1 for testing the first type semiconductor chip 130D1, among the terminals TP of the test apparatus T. The second lower terminal 120_L21 of the interface board 120C may correspond to the channel terminal TP_21 among the terminals TP of the test apparatus T.

A second signal that is a channel signal to test whether a crack defect exists in the second type semiconductor chip 130D2 and the third type semiconductor chip 130D3 may be input to the channel terminal TP_21.

Since both of the second upper terminal group 120_U2C and the third upper terminal group 120_U3C are connected to the second lower terminal 120_L21 in the interface board 120C, the interface board 120C may be manufactured in a simpler structure and at a lower cost, compared to the interface board 120B of FIG. 9.

Figure 11:
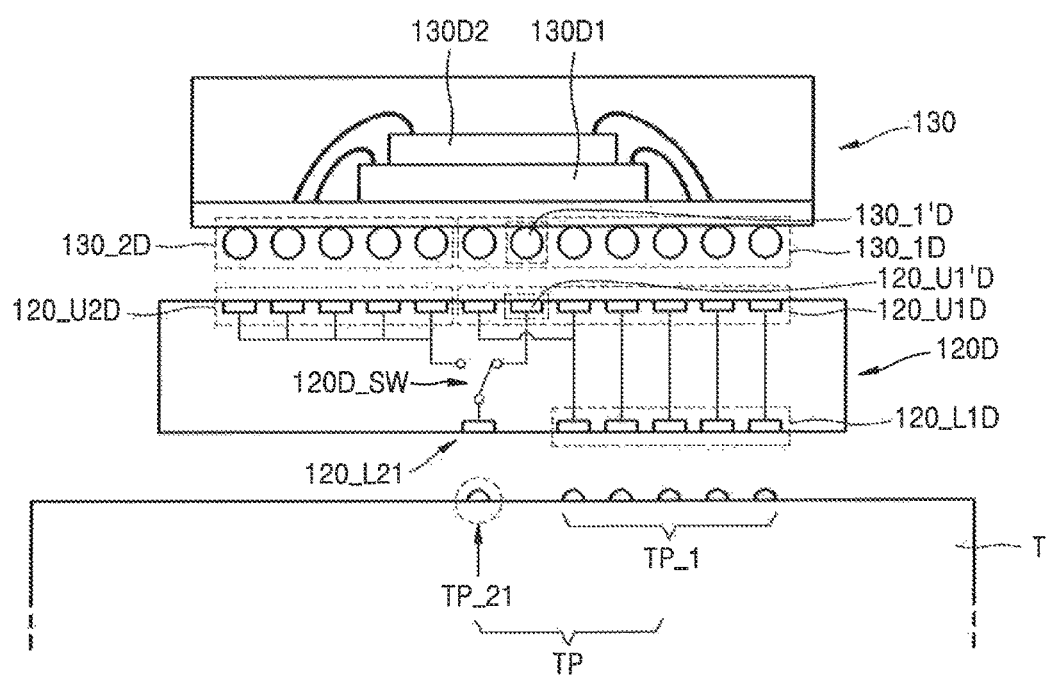
FIG. 11 is a side view illustrating a user state of an interface board according to an exemplary embodiment of the inventive concept.

FIG. 11 is a side view illustrating a user state of an interface board 120D according to an exemplary embodiment of the inventive concept.

Referring to FIG. 11, a second upper terminal group 120_U2D and a power terminal 120_U1D of a first upper terminal group 120_U1D are connected to the second lower terminal 120_L21 using a switch device 120D_SW, which is different from the embodiment of FIG. 9.

The first terminal group 130_1D may correspond to the first upper terminal group 120_U1D provided on an upper surface of the interface board 120D. The second terminal group 130_2D may correspond to the second upper terminal group 120_U2D provided on the upper surface of the interface board 120D. Among the first terminal group 130_1D, a power terminal 130_1'D may correspond to the power terminal 120_U1'D of the first upper terminal group 120_U1D provided on the interface board 120D. The second upper terminal group 120_U2D and the power terminal 120_U1'D of the first upper terminal group 120_U1D correspond to the second lower terminal 120_L21 via the switch device 120D_SW.

The second upper terminal group 120_U2D may be provided to test only whether a crack defect exists in the second type semiconductor chip 130D2.

Terminals of the first upper terminal group 120_U1D may respectively correspond to terminals of a first lower terminal group 120_L1D provided on a lower surface of the interface board 120D. The second upper terminal group 120_U2D and the power terminal 120_U1'D of the first upper terminal group 120_U1D may be connected to the second lower terminal 120_L21 by the switch device 120D_SW.

The first lower terminal group 120_L1D of the interface board 120D may correspond to the first test terminal group TP_1 to test the first type semiconductor chip 130D1 among the terminals TP of the test apparatus T. The power terminal 120_U1'D of the first upper terminal group 120_U1D may connect to the second lower terminal 120_L21 by the switch device 120D_SW. The second lower terminal 120_L21 of the interface board 120D may correspond to a power terminal TP_21 of the terminals TP of the test apparatus T.

The second upper terminal group 120_U2D to test whether a crack defect exists in the second type semiconductor chip 130D2 may correspond to the power terminal TP_21 among the terminals TP of the test apparatus T as the switch device 120D_SW is connected thereto.

In the interface board 120D, the second upper terminal group 120_U2D and the power terminal 120_U1'D of the first upper terminal group 120_U1D are selectively connected to the second lower terminal 120_L21 by the switch device 120D_SW.

According to the above-described embodiments, whether a crack defect exists in a semiconductor chip may be easily determined by just a simple leak current test without having to transfer the semiconductor chip. Accordingly, an efficiency of an individual test is maintained in the final operation of an existing test method.

Furthermore, according to the above-described embodiments, the test cost may be reduced because the existing test equipment may be used as is by replacing just the interface board.

While the inventive concept has been particularly shown and described with reference to exemplary embodiments thereof, it will be understood that various changes in form and details may be made therein without departing from the spirit and scope of the inventive concept as defined by the following claims.

What is claimed is:

1. An interface board for testing a multichip package, wherein the multichip package comprises a first type semiconductor chip and a second type semiconductor chip, the interface board comprising:
   a first surface facing the multichip package and a second surface facing a test apparatus,
   the first surface comprises upper terminals that are configured to be electrically connected to terminals of the multichip package,
   the second surface comprises lower terminals that are configured to be electrically connected to the test apparatus, and
   the upper terminals comprise a first upper terminal group for testing the first type semiconductor chip and a second upper terminal group for testing whether a crack defect exists in the second type semiconductor chip,
   wherein a first portion of the second upper terminal group is configured to be electrically connected to power terminals of the second type semiconductor chip and a second portion of the second upper terminal group is configured to be electrically connected to channel terminals of the second type semiconductor chip, and
   wherein the first portion of the second upper terminal group is provided with a channel signal to test whether the crack defect exists in the second type semiconductor chip and the first upper terminal group is grounded while the channel signal is input to the first portion of the second upper terminal group.

2. The interface board of claim 1, wherein the second upper terminal group is only used to test whether the crack defect exists in the second type semiconductor chip.

3. The interface, board of claim 2, wherein the entire second upper terminal group is configured to be electrically connected to a single signal terminal of the test apparatus.

4. The interface board of claim 3, wherein terminals of the second upper terminal group are connected to one another in the interface hoard.

5. The interface board of claim 2, wherein the second upper terminal group is configured to be electrically connected to the power terminals of the second type semiconductor chip.

6. The interface board of claim 1, wherein signal terminals of the first type semiconductor chip and signal terminals of the second type semiconductor chip are not electrically connected to each other in the multichip package.

7. The interface board of claim 1, wherein one of the first type semiconductor chip and the second type semiconductor chip is a non-volatile memory device, and the other one is a volatile memory device.

8. The interface board of claim 7, wherein the non-volatile memory device comprises a plurality of semiconductor chips.

9. The interface board of claim 1, wherein the multichip package further comprises a third type semiconductor chip, and the upper terminals further comprise a third upper terminal group for testing whether a crack defect exists in the third type semiconductor chip.

10. The interface board of claim 9, wherein the third upper terminal group is configured to be electrically connected to a same terminal of the test apparatus.

11. The interface board of claim 10, wherein the third upper terminal group is configured to be electrically connected to a same terminal as a terminal of the test apparatus to which the second upper terminal group is connected.

12. The interface board of claim 11, wherein the third upper terminal group is connected to the second upper terminal group in the interface board.

13. A multichip package test system, comprising:
a plurality of test apparatuses sequentially arranged in a test order;
a plurality of chamber units for connecting semiconductor devices contained in a test tray to the plurality of test apparatuses;
a transfer portion for carrying the test tray between the plurality of chamber units; and
a controller for controlling the plurality of chamber units,
wherein a multichip package comprises a first type semiconductor chip and a second type semiconductor chip,
a final test apparatus of the plurality of test apparatuses further comprises an interface board for testing the multichip package,
the interface board comprises a first surface facing the multichip package and a second surface facing test terminals,
the first surface comprises upper terminals that are configured to be electrically connected to terminals of the multichip package,
the second surface comprises lower terminals that are configured to be electrically connected to the test terminals, and
the upper terminals comprise a first upper terminal group for testing the first type semiconductor chip and a second upper terminal group for testing whether a crack defect exists in the second type semiconductor chip,
wherein the final test apparatus is configured to apply a first signal to the multichip package to test the first type semiconductor chip and a second signal to the multichip package to test whether the crack defect exists in the second type semiconductor chip.

14. The multichip package test system of claim 13, wherein the second upper terminal group is configured to be electrically connected to a single terminal of the test apparatus.

15. The multichip package test system of claim 14, wherein the single terminal does not receive a power signal from the test apparatus.

16. The multichip package test system of claim 13, wherein applying the second signal to test whether the crack defect exists in the second type semiconductor chip and determining an existence of the crack defect according to a result of the application of the second signal are performed last in the final test apparatus.

17. An interface board, comprising:
a first surface facing a multichip package to be tested and a second surface facing a test apparatus,
wherein the first surface comprises:
a first upper terminal group for testing a first type semiconductor chip of the multichip package; and
a second upper terminal group for testing whether a crack defect exists in a second type semiconductor chip of the multichip package,
wherein the second surface comprises:
a first lower terminal group for connecting the first upper terminal group to the test apparatus; and
a second lower terminal for connecting the second upper terminal group to the test apparatus, and
wherein terminals of the second upper terminal group are electrically connected to one another in the interface board,
wherein a first portion of the second upper terminal group is configured to be electrically connected to a first terminal of the test apparatus via the second lower terminal and a second portion of the second upper terminal group is configured to be electrically connected to a second terminal of the test apparatus via the second lower terminal, and
wherein the first portion of the second upper terminal group is provided with a channel signal, via the first terminal of the test apparatus, to test whether the crack defect exists in the second type semiconductor chip and the second portion of the second upper terminal group is grounded, through the second terminal of the test apparatus, while the channel signal is input to the first portion of the second upper terminal group.

18. The interface board of claim 17, wherein the interface board is a hi-fix board.

* * * * *